(12) United States Patent
Kozaki et al.

(10) Patent No.: US 7,397,834 B2
(45) Date of Patent: Jul. 8, 2008

(54) NITRIDE SEMICONDUCTOR LASER DEVICE AND METHOD OF MANUFACTURING THE NITRIDE SEMICONDUCTOR LASER DEVICE

(75) Inventors: Tokuya Kozaki, Anan (JP); Keiji Sakamoto, Anan (JP); Hiroaki Matsumura, Tokushima (JP)

(73) Assignee: Nichia Corporation, Anan-shi (JP)

( * ) Notice: Subject to any disclaimer, the term of this patent is extended or adjusted under 35 U.S.C. 154(b) by 52 days.

(21) Appl. No.: 10/888,497

(22) Filed: Jul. 12, 2004

(65) Prior Publication Data

US 2005/0030994 A1    Feb. 10, 2005

(30) Foreign Application Priority Data

| Jul. 11, 2003 | (JP) | ............................. 2003-273195 |
| Oct. 31, 2003 | (JP) | ............................. 2003-371557 |

(51) Int. Cl.
*H01L 21/00* (2006.01)
*H01S 5/00* (2006.01)

(52) U.S. Cl. .................................. 372/46.012; 438/462

(58) Field of Classification Search ............ 372/46.012; 438/462

See application file for complete search history.

(56) References Cited

U.S. PATENT DOCUMENTS 6,456,638 B1   9/2002   Fukunaga

2003/0030053 A1   2/2003   Nawakami et al.
2003/0123503 A1*  7/2003   Matsumoto et al. ........... 372/45

OTHER PUBLICATIONS

Shuji Nakamura et al., High-Power, Long-Lifetime InGaN/GaN/AlGaN-Based Laser Diodes Grown on Pure GaN Substrates, Japanese Journal of Applied Physics, Mar. 1998, pp. L309-L312, vol. 37, Part 2, No. 3B, The Japan Society of Applied Physics and The Physical Society of Japan.

Zheleva, T. et al., "Dislocation Density Reduction Via Lateral Expitaxy in Selectively Grown GaN Structures", Applied Physics Letters, pp. 2472-2474, Oct. 1997, vol. 71, No. 17, American Institute of Physics, New York, U.S.A.

* cited by examiner

*Primary Examiner*—Minsun Harvey
*Assistant Examiner*—Marcia A. Golub
(74) *Attorney, Agent, or Firm*—Smith Patent Office (57) ABSTRACT

The nitride semiconductor laser device has a counter electrode structure where contact resistance is reduced and manufacturing methods thereof are provided. The nitride semiconductor laser device comprises a nitride semiconductor substrate having a first main surface and a second main surface. A nitride semiconductor layer is stacked on the first main surface of the nitride semiconductor substrate. A ridge-shaped stripe is formed in the nitride semiconductor layer, and a resonance surface forms an optical waveguide in the direction perpendicular to the length of the ridge-shaped stripe. A first region having a crystal growth facet in the (0001) plane and a second region on the first main surface or the second main surface are provided. Further, a recess is formed in the second region of the first main surface and/or the second main surface. A ridge-shape stripe is formed over the first main surface of the nitride semiconductor substrate.

13 Claims, 8 Drawing Sheets

NITRIDE SEMICONDUCTOR LASER DEVICE AND METHOD OF MANUFACTURING THE NITRIDE SEMICONDUCTOR LASER DEVICE

BACKGROUND OF THE INVENTION

1. Field of the Invention

The present invention relates to a nitride semiconductor laser made of a nitride semiconductor ($In_aAl_bGa_{1-a-b}N$, $0 \leq a$, $0 \leq b$, $a+b \leq 1$), and particularly to a nitride semiconductor laser device formed with a good resonant surface that is reproducible by way of a cleavage process and has an excellent lifetime and mass productivity.

2. Discussion of the Related Art

Recently, small size, lightweight, high reliability, and a high output properties have been required for nitride semiconductor laser devices, and they are used as a light source for an optical disc such as a DVD and a light source for medical equipment. Various research has been conducted on nitride semiconductor laser devices.

For example, as a practical laser device, a nitride semiconductor laser device capable of continuous-wave oscillation of more than 10,000 hours at room temperature is described in Japan Journal of Applied Physics, Vol. 37 (1998), pp. L309-L312, Part 2, No. 3B, Mar. 15, 1998. According to this article, the nitride semiconductor laser device is obtained by the following procedures. First, a nitride semiconductor substrate made of GaN is selectively grown on a sapphire substrate. A plurality of nitride semiconductor layers comprising a laser device structure are stacked on the nitride semiconductor substrate. Then, the sapphire substrate is removed and a resonator is formed by a cleavage process. This nitride semiconductor laser device has a ridge stripe. The ridge stripe is formed by partially etching from a p-side contact layer made of p-GaN to a p-side cladding layer of a super lattice structure. The super lattice structure made of p-$Al_{0.14}Ga_{0.86}$N/GaN disposes a p-electrode on the stripe, and a resonance surface is formed by the cleavage process.

However, many defects may occur in a wafer of the laser device described above, such as poor reproducibility upon cleavage or a poor lifetime thought to be caused by deterioration due to insufficient heat dissipation. The cause is thought to be that even when the foreign substrate made of a different material from the nitride semiconductor layer is removed, the cleavage surfaces of the nitride semiconductor substrate and the nitride semiconductor are not completely the same. Therefore, chipping off and crushing occur in the top layer of the stripe ridge by the impact generated when the resonance surface is formed by cleavage. There have been other problems with the construction of the nitride semiconductor laser device. These problems include that the width of the ridge is small compared with the chip size of the nitride semiconductor laser device so that the damage tends to concentrate in the ridge. Also, the deterioration of the ridge progresses due to oscillation as a laser device even if the damage such as chipping off was not seen when cleaving, and consequently, the laser device is incapable of long hours of continuous-wave oscillation.

In addition, a large chip size is required when the p-electrode and the n-electrode are disposed on the same surface of a wafer. However, the chip size can be reduced by fabricating a laser device with a counter electrode structure where the n-electrode is disposed on the rear surface of the nitride semiconductor substrate. As a result, the number of chips formed in a wafer can be greatly increased. However, a nitride semiconductor laser device having the n-electrode with good ohmic features on the rear surface of the substrate has not been achieved.

SUMMARY OF THE INVENTION

An object of the present invention is to provide a nitride semiconductor laser device having good lifetime with high reliability where occurrence of chipping off and the like are prevented even when the resonance surface is formed by cleavage.

Namely, the objects of the present invention can be achieved with the following constructions (1) to (5).

(1) A nitride semiconductor laser device comprising: a nitride semiconductor substrate having a first main surface and a second main surface; a nitride semiconductor layer stacked on the first main surface of said nitride semiconductor substrate; a ridge-shaped stripe formed in the nitride semiconductor layer; and a resonance surface forming an optical waveguide in the direction perpendicular to the length direction or longitudinal axis of the ridge-shaped stripe; wherein the nitride semiconductor substrate comprises a first region having a crystal growth surface in the (0001) plane and a second region having a crystal growth surface at least different from that of the first region, and a groove (recessed area) is formed in the second region of at least one of the first main surface and the second main surface.

(2) The nitride semiconductor laser device as set forth in (1), wherein the nitride semiconductor substrate has a ridge-shaped stripe over the first main surface.

(3) The nitride semiconductor laser device as set forth in (1) or (2), wherein the first region and the second region are formed into alternate stripes adjacent to each other.

(4) The nitride semiconductor laser device as set forth in (1), wherein the crystal growth surface of the nitride semiconductor substrate is substantially rectangular and the groove (recessed area) on the second main surface of the nitride semiconductor substrate is formed in at least one of the four corners of the rectangular portion.

(5) The nitride semiconductor laser device as set forth in (1), wherein the first region has fewer dislocations than that in the second region.

The objects of the present invention can also be achieved with the following constructions (6) to (8).

(6) A nitride semiconductor laser device comprising: a nitride semiconductor substrate having a first main surface and a second main surface; a nitride semiconductor layer stacked on the first main surface of the nitride semiconductor substrate; a ridge-shaped stripe formed in the nitride semiconductor layer; and a resonance surface being perpendicular to the length direction or longitudinal axis of the ridge-shaped stripe; wherein the second main surface of the nitride semiconductor substrate comprises a first region with a crystal growth surface in the (000-1) plane and a second region with a crystal growth surface at least different from that of the first region, and an electrode is formed on the second main surface.

(7) The nitride semiconductor laser device as set forth in (6), wherein the second region in the second main surface has a region with a crystal growth surface in the (0001) plane.

(8) The nitride semiconductor laser device as set forth in (1) or (6), wherein the first main surface and the second main surface are opposite each other, and the first region on the second main surface is located beneath the first region of the first main surface.

That is, in the present invention, a nitride semiconductor substrate is employed and a part of the crystal growth surface is made with a different plane in order to cancel the stress and the distortion generated in the substrate. Specifically, the nitride semiconductor substrate includes a first main surface and a second main surface. The first main surface is set to be the (0001) plane and the second main surface is set to be a different crystal growth surface from the (0001) plane. The (000-1) plane, (11-20) plane, (10-15) plane, (10-14) plane, and (11-24) plane or the like are used for the second main surface. Moreover, the second main surface includes at least two different crystal growth surfaces. When the first region is the (000-1) plane, the second region is the (0001) plane and the like.

In the nitride semiconductor substrate having such a construction, the first region will only be affected by the stress and the distortion generated in the first region and it will be prevented from the stress and the distortion generated in the adjacent second region. Therefore, in the nitride semiconductor laser device having the ridge-shaped stripe on the first region, the stress loaded to the inner portion of the ridge can be suppressed. Therefore, the device is capable of enduring the impact generated by the cleaving process.

When the first region and the second region are formed into alternate stripes adjacent to each other, a stress relief action works in the nitride semiconductor substrate. Therefore, a nitride semiconductor device with stacked layers can be formed to a thickness of 5 μm or more without disposing a stress relief layer on the nitride semiconductor substrate. The first region has a width of 100 μm or more, and the second region has a width of 1 μm or more. It is preferable for relieving the stress that the first region at least includes the (0001) plane and the second region is the (000-1) plane. Here, the first region may have planes such as a (11-20) plane besides the (0001) plane.

Moreover, the occurrence of ripples in the FFP (Far Field Pattern) can be prevented by forming a groove on the surface and/or the rear surface of the nitride semiconductor. By this construction, the beam profile of the laser beam can be improved and the usages such as optical discs and optical pick-ups can be realized. Furthermore, the occurrence of detachment of the n-electrode, which is disposed on the rear surface of the substrate, can be prevented by forming the groove on the rear surface of the nitride semiconductor substrate.

The characteristics of the nitride semiconductor laser device which has the ridge-shaped stripe depends on the crystallinity of the nitride semiconductor. The crystallinity of the nitride semiconductor remarkably influences the ridge portion. For example, if a fracture or the like exists in the ridge portion when the nitride semiconductor is cleaved, rapid deterioration from the fracture occurs by continuous-wave oscillation. Therefore, it is difficult to obtain a laser device capable of maintaining a continuous-wave oscillation over an extended time period. In the laser device of the present invention, the stress lies only within each region. Therefore, the nitride semiconductor crystal can be prevented from cracking in a direction different from the cleavage direction at the time of cleavage. Moreover, when a groove is formed in the second main surface, it becomes easy to dispose the n-electrode on the second main surface. Also, it becomes easy to dispose an end-surface protective coat and a mirror on the resonance surface by forming the grooves.

The above-mentioned nitride semiconductors include GaN, AlN, etc., compounds of a group-III element such as B, Ga, and Al and nitrogen, and ternary or quaternary mixed crystal compounds. In addition, the nitride semiconductors also include the above-mentioned compounds doped with an n-type impurity or a p-type impurity. The crystal structure of the nitride semiconductor will be described here with GaN as an example. Another exposed surface may be formed by making an off-angle surface on the surface of the nitride semiconductor substrate or grinding the surface of the nitride semiconductor substrate by way of etching or the like.

The off-angle surface is controlled in the range from equal to or greater than 0.02° to equal to or less than 90°.

In the above-mentioned nitride semiconductor substrate, the full width at half maximum of the X-ray rocking curve at (0002) diffraction using the biaxial crystal method is 2 minutes or less, and preferably 1 minute or less. By growing the nitride semiconductor having an active layer or a light emitting layer on a substrate which is a nitride semiconductor substrate having a few dislocations, a power laser device and a high intensity LED and the like can be realized.

It is preferable that an electrode is disposed on the second main surface of the nitride semiconductor substrate. The electrode includes at least one element selected from the group consisting of Ti, Ni, Au, Pt, Al, Pd, W, Rh, Ag, Mo, V, and Hf. In addition, the electrode is preferably an n-electrode. The electrode has a multilayer structure and the first layer thereof being in contact with the nitride semiconductor is made of at least one element selected from the group consisting of Ti, W, Mo, V, and Hf. In the nitride semiconductor device with the counter electrode structure, the electric current flows only along the longitudinal direction in the semiconductor so that a heavy current can be applied. However, the deterioration at the interface between the nitride semiconductor and the electrode and the quality of the ohmic features become new problems. Therefore, in the present invention, the electrode is formed to be a multilayer structure, and the above-mentioned Ti, W, Mo, V, and Hf, etc. are used as the electrode that establishes excellent ohmic features with the (000-1) plane and/or a plane other than the (000-1) plane of the nitride semiconductor. Moreover, the top layer of the multilayer structure is preferably made of Pt or Au, because the heat dissipation from the electrode can be improved with this construction.

Moreover, the object of the present invention can also be achieved with the following constructions (9) and (10).

(9) A method for manufacturing a nitride semiconductor laser device comprising the steps of: forming a nitride semiconductor substrate having a first main surface and a second main surface; a nitride semiconductor layer stacked on the first main surface of the semiconductor substrate; a ridge-shaped stripe formed in the nitride semiconductor layer, and a resonance surface being in the direction perpendicular to the ridge-shaped stripe, wherein a process of dividing the nitride semiconductor substrate into bars comprises a step of forming a groove in at least one of the first main surface and second main surface, and a step of breaking.

(10) The manufacturing method of the nitride semiconductor laser device as set forth in (9), wherein the groove is formed by a method selected from point scribing, laser scribing, and RIE.

According to the present invention, detachment of the p-electrode and chipping off of the ridge can be prevented even when the resonance surface is formed by cleavage to further improve practicability. Therefore, a nitride semiconductor laser device having high reliability and an excellent life can be provided with good productivity. Furthermore, by using the manufacturing method according to the present invention, occurrence of cleavage flaws can be prevented at the time of the cleavage. In addition, the nitride semiconductor device with a counter electrode structure showing the ohmic features can be formed in this invention. The present invention can provide the nitride semiconductor device of the counter electrode structure where contact resistance is reduced. The contact resistivity is $1.0 \mathrm{E}^{-3} \Omega$ cm$^2$ or less, and preferably $5.0 \mathrm{E}^{-4} \Omega$ cm$^2$ or less.

DETAILED DESCRIPTION OF THE PREFERRED EMBODIMENTS

Preferred embodiments of the nitride semiconductor laser device and the manufacturing method thereof according to the present invention will now be described below with reference to the accompanying drawings.

The nitride semiconductor laser device according to the present invention comprises a nitride semiconductor substrate 101 having a first main surface and a second main surface. The nitride semiconductor layers are stacked onto the first main surface of the nitride semiconductor substrate 101, and a ridge-shaped stripe is formed in the nitride semiconductor layers. The nitride semiconductor laser device has a resonance surface in the direction perpendicular to the length direction of the ridge-shaped stripe. The nitride semiconductor substrate 101 comprises a first region with a crystal growth surface in the (0001) plane and a second region having a plane at least different from that of the first region. A groove is formed in the second region of the first main surface and/or the second main surface. An optical waveguide is formed with the resonant surface. In the nitride semiconductor substrate 101 having the first main surface and the second main surface, when the first main surface is a growth surface of the nitride semiconductor multilayer structure, the second main surface is a surface where an electrode, preferably the n-electrode is disposed. Moreover, the first main surface and the second main surface are formed opposite each other. For example, the first region in the first main surface is at an almost opposite side position from the first region of the second main surface. This is similar for the second region as well.

The nitride semiconductor layer has a ridge-shaped stripe on the first main surface of the nitride semiconductor substrate 101. The ridge-shaped stripe forms an optical waveguide. It is preferable that the first main surface has a ridge-shaped stripe over its first region. Here, when the side surface of the ridge-shaped stripe has an insulation layer 300, a light confinement effect and an electric current leak prevention effect can be provided. A p-electrode 301, and a p-pad electrode 303 are disposed on the top layer of the ridge-shaped stripe and are electrically connected to each other.

A nitride semiconductor laser device with the counter electrode structure can be realized by forming an n-electrode 401 on the second main surface of the nitride semiconductor substrate 101. The dislocation density in the first region of the nitride semiconductor substrate 101 is $1 \times 10^6$/cm$^2$ or less, and preferably is $1 \times 10^5$/cm$^2$ or less. The lifetime can be improved by forming the ridge in the upper part of this low dislocation region as an optical waveguide.

A construction having recesses and protrusions can be formed on the contact surface with the n-electrode 401 on the second main surface of the nitride semiconductor substrate 101. Moreover, a slope which is a side surface of the step of a recess and a protrusion can be exposed by forming a recess and a protrusion in a tapered shape. The above-described slope means can be, for example, a plane other than the (000-1) plane. Therefore, the plane indices thereof are not limited to a single plane and can be the (10-15) plane, the (10-14) plane, and the (11-24) plane and the like. The depth of the recess and the protrusion are not specifically limited. The total area of the slopes other than that of the (000-1) plane is preferably 0.5% or more of the surface area of a plane which shows the n-polarity. If the aforementioned area is less than 0.5%, the contact resistance rises and the ohmic features cannot be observed.

It is preferable that the nitride semiconductor substrate 101 has a first region, a second region as another crystal growth surface, and the polarity of the second region is preferably reversed compared with the first region. This is because the stress generated in the nitride semiconductor substrate 101 can be reduced. For example, if the first region is made with the (0001) plane, the second region becomes the (000-1) plane. Therefore, when the first main surface and the second main surface are opposite surfaces in the nitride semiconductor substrate 101, the first region in the first main surface is the (0001) plane and the second region having reversed polarity becomes the (000-1) plane. Furthermore, the first region in the second main surface becomes the (000-1) plane, and the second region becomes the (0001) plane.

In the nitride semiconductor substrate 101, it is preferable that the first region and the second region are formed into alternate stripes. When the first region is the (0001) plane and the second region is the (000-1) plane, regions with different polarity exist on the first main surface. Recesses and protrusions can be formed on the surface by conducting a wet-etching, a dry-etching, or a CMP (Chemical Mechanical Polishing) treatment on the surface of the nitride semiconductor substrate 101. The reason is that the etching rates are different in each polarity. This is similar either in the first main surface or the second main surface. When the first main surface and the second main surface of the nitride semiconductor substrate 101 form opposite surfaces, contrary to the first surface, the first region in the second main surface becomes the (000-1) plane and the second region becomes the (0001) plane. When the etching is carried out from the second main surface of the nitride semiconductor substrate 101 of such construction, the recesses and the protrusions are formed with protrusions which are in the second region and with recesses which are in the first region. This is due to the difference in the etching rates.

Moreover, it is thought that the action to ease the stress in the nitride semiconductor substrate 101 works if the first region and the second region are formed into alternate stripes. The stress is not uniformly generated within a surface, but lies in each region because the polarities are different in the first region and the second region. Therefore, it is possible to make the nitride semiconductor device with a thickness of 5 μm or more, without the stress relief layer being provided to the nitride semiconductor layer stacked on the nitride semiconductor substrate 101. The stripe of the ridge-shaped stripe in the nitride semiconductor laser device is preferably formed on the (0001) plane. The width of the stripe of the (0001) plane on the first main surface is controlled to be 50 μm or more to form the nitride semiconductor laser device on the first main surface of the substrate. In the first main surface, when the (0001) plane is the first region and the (000-1) plane is the second region, the stripe width of the first region is controlled to be 100 μm or more, preferably 200 μm or more, and more preferably 300 μm or more. The stripe width of the second region is controlled to be from 1 μm to 40 μm inclusive, and preferably from 10 μm to 30 μm, inclusive. This is not limited by the size of the nitride semiconductor substrate 101. Moreover, the peripheral configuration of the nitride semiconductor substrate 101 is not especially limited, and a wafer with a circular or a rectangular periphery can be used.

Furthermore, the first region and the second region are formed into alternate stripes with the widths in the range described above on the nitride semiconductor substrate 101 and the width ratio of the stripes (first region/second region) is preferably controlled to be 5 μm or more, and more preferably 10 μm or more. With this construction, the cleavage process can be performed with a good reproducibility even on the resonance surface of the nitride semiconductor laser device. At the same time, the resonance surface can be made into a mirror surface with its crack formation being controlled.

The thickness of the nitride semiconductor substrate 101 is controlled to be from 50 μm to 500 μm inclusive, preferably not greater than 200 μm, and further preferably from 50 μm to 150 μm inclusive. If the thickness is in this range, the reproducibility of the cleavage after the nitride semiconductor laser device is formed can be improved. If the thickness of the nitride semiconductor substrate 101 is less than 50 μm, handling in the process becomes difficult.

In the nitride semiconductor substrate 101, the impurity concentration (carrier concentration) of Si, O, Ge, and C and the like is controlled to be $1 \times 10^{18}$ cm$^{-3}$ or more, preferably in the range from $5 \times 10^{18}$ cm$^{-3}$ to $5 \times 10^{20}$ cm$^{-3}$ inclusive. The electrode formed on the second main surface shows the ohmic features with the impurity concentration (carrier concentration) within this range.

The nitride semiconductor substrate 101 is formed, for example, by growing the nitride semiconductor on a foreign substrate such as sapphire, SiC, and GaAs to a thickness of equal to or greater than 100 μm by way of a Halide Vapor Phase Epitaxy method (hereafter referred to as the HVPE method), and removing the foreign substrate afterwards. Here, the plane where the foreign substrate was removed is the (000-1) plane of the nitride semiconductor 101. The slopes other than the (000-1) plane are formed by way of a dry etching, a wet etching, and a chemical mechanical polish (hereafter referred to as CMP). Moreover, the nitride semiconductor is not easily damaged even in the process of removing the foreign substrate on the condition that the crystallinity of the nitride semiconductor is set to 3 minutes or less, and preferably to 2 minutes or less in the full width at half maximum of an X-ray rocking curve at (0002) diffraction using a biaxial crystal method. Therefore, the nitride semiconductor having a thickness of equal to or greater than 100 μm can be obtained while retaining a good crystallinity. After that, a new nitride semiconductor device is formed on the (0001) plane of the above-mentioned nitride semiconductor.

It is preferable that the above-mentioned nitride semiconductor substrate 101 is formed on the foreign substrate via the buffer layer represented by GaN or $Al_aGa_{1-a}N$ ($0.01 \leq a \leq 0.5$). The purpose of this is to improve crystallinity. The growth temperature of the buffer layer is set equal to or lower than 800° C. of the low temperature growth. By this method, occurrence of dislocations and pits in the nitride semiconductor can be reduced. An $Al_xGa_{1-x}N (0 \leq X \leq 1)$ layer may be further grown by an ELO (Epitaxial Lateral Overgrowth) method, after the buffer layer is grown on the foreign substrate by way of the metalorganic vapor phase epitaxial growth method (hereafter referred to as the MOCVD method). With this ELO method, the nitride semiconductor is grown in the lateral direction so that the threading dislocations are bent and converged. As a result, the dislocations reaching the surface can be reduced and the crystallinity can be improved. It is preferable to combine the above-mentioned constructions to form the first region and the second region in the nitride semiconductor substrate 101.

Each process of manufacturing the nitride semiconductor laser device from the wafer-shape to the chip-shape will be described in the following preferred embodiments with reference to the accompanying drawings shown in FIG. 7 and FIG. 8. However, the nitride semiconductor laser device of the present invention is not limited to the following embodiments.

Embodiments 1 and 2

(First Process)

Figure 7A:
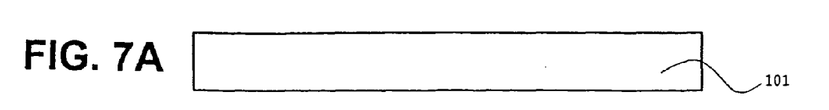
FIGS. 7A to 7E illustrate a manufacturing process for the nitride semiconductor laser device according to a second embodiment of the present invention.
Figure 8:
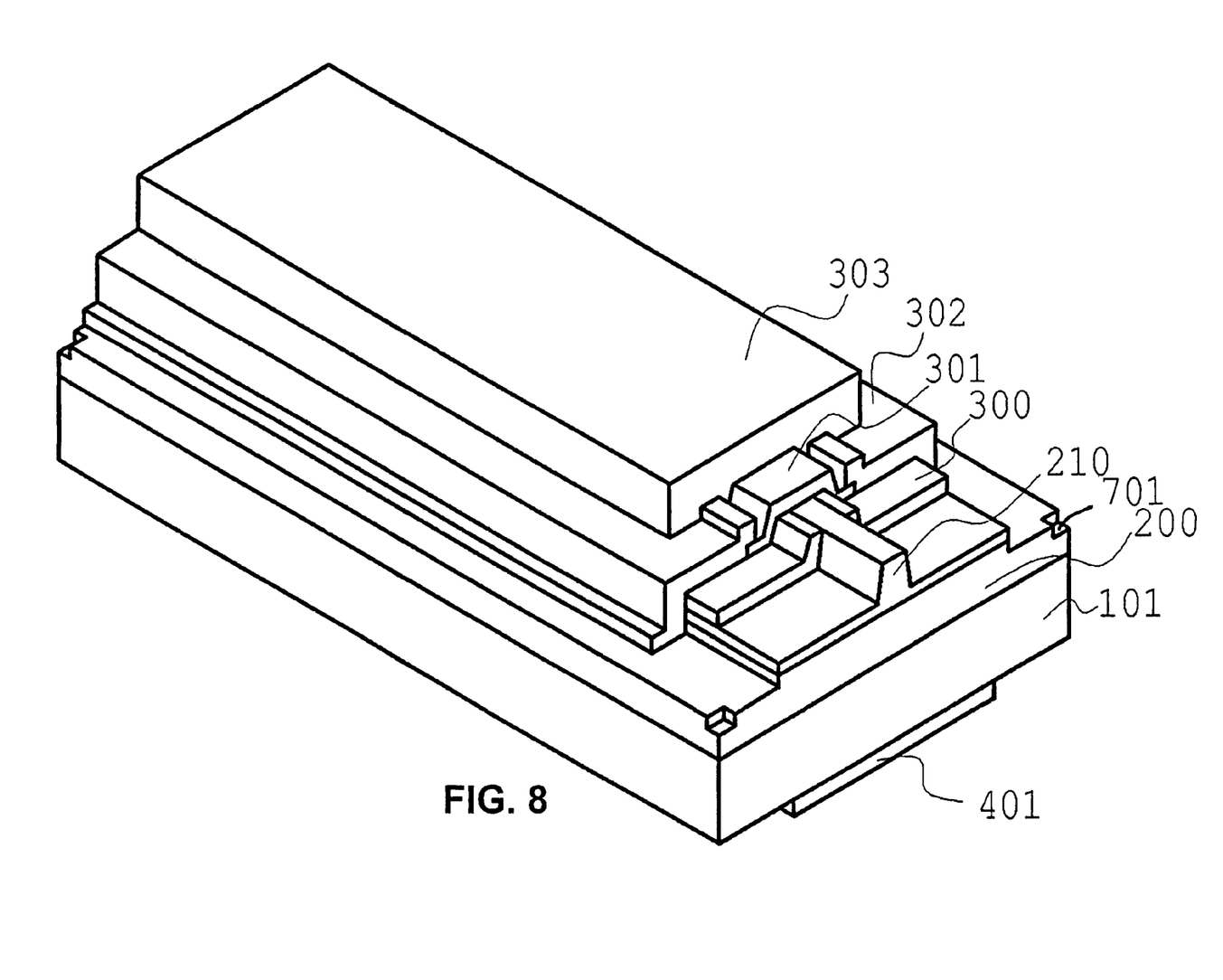
FIG. 8 is a schematic perspective view of a nitride semiconductor device obtained by a manufacturing process according to the second embodiment of the present invention.

First, a nitride semiconductor substrate 101 is prepared (FIG. 7A). A nitride semiconductor is grown on a foreign substrate such as sapphire or GaAs via a buffer layer (not shown). After that, the foreign substrate is removed by grinding, electromagnetic irradiation (excimer laser radiation etc.), or CMP, etc. and the nitride semiconductor substrate 101 is obtained. A surface having n-polarity is exposed on the nitride semiconductor where the foreign substrate was removed. A damaged layer may appear on the n-polarity surface as a result of removing the foreign substrate by grinding or excimer laser irradiation, the damaged layer can be removed by CMP or dry etching. By this process, the thickness and the surface roughness of the nitride semiconductor can also be adjusted by removing the damaged layer. The resulting nitride semiconductor substrate 101 comprises a first main surface and a second main surface with a thickness from 0.2 mm to 10 mm.

The foreign substrate is only required to be capable of epitaxally growing the nitride semiconductor thereon. The size and the thickness of the foreign substrate are not specifically limited. The specific examples of the foreign substrate comprise an insulating substrate such as sapphire with a main surface of either C-plane or A-plane and spinel (MgAl2O4), silicon carbides (6H, 4H, 3C), silicone, ZnS, ZnO, GaAs, and diamond, and an oxide substrate such as lithium niobate and Neodymium Gallate which form a lattice junction with the nitride semiconductor. Moreover, the nitride semiconductor substrate 101 such as GaN and AlN can be used when the film thickness thereof is sufficient for device processing (greater than a few tens of microns).

(Second Process)

Figure 7B:
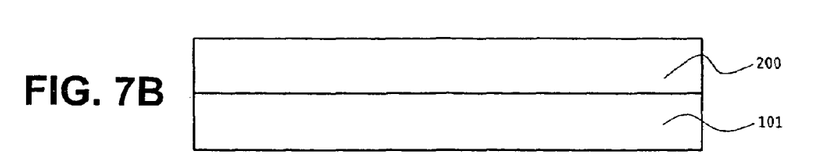

A nitride semiconductor layer 200 is grown on the nitride semiconductor substrate 101 (FIG. 7B). In the present embodiment, the nitride semiconductor layer 200 is grown on the first main surface of the nitride semiconductor substrate 101. The nitride semiconductor layer 200 forms a separate confinement heterostructure (SCH) with the active layer containing In. Both sides of the active layer are sandwiched by the optical guide layers having a bandgap larger than that of the active layer, so as to construct the optical waveguide.

Figure 1:
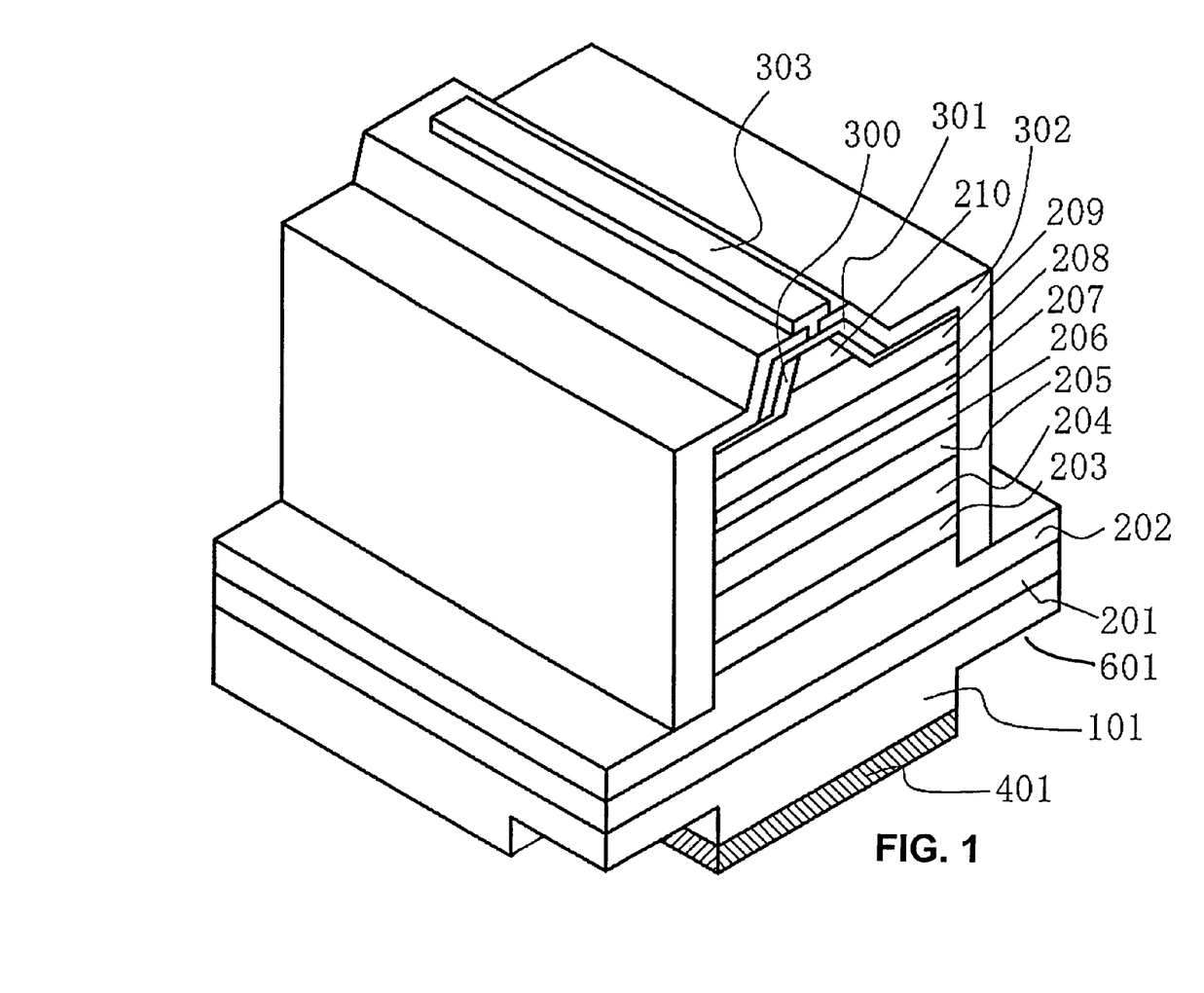
FIG. 1 is a schematic perspective view showing a portion of a nitride semiconductor laser device according to a first embodiment of the present invention.

In the embodiment of the nitride semiconductor layer 200 shown in FIG. 1, a buffer layer 201, an n-side contact layer 202 of $Al_xGa_{1-x}N$ ($0 \leq x \leq 1$) doped with an n-type impurity, a crack preventing layer 203 of an InGaN doped with an n-type impurity, an n-side cladding layer 204 of a superlattice structure consisting of $Al_xGa_{1-x}N$ ($0 \leq x \leq 1$) doped with an n-type impurity and undoped $Al_xGa_{1-x}N$ ($0 \leq x \leq 1$), and an n-side optical guide layer 205 of $Al_xGa_{1-x}N$ ($0 \leq x \leq 1$) are grown as the n-side layer. The n-side cladding layer 204 may be a single layer made of $Al_xGa_{1-x}N$ ($0 \leq x \leq 1$) doped with an n-type impurity. The buffer layer 201, the n-side contact layer 202, and the crack preventing layer 203 can be omitted. The active layer 206 is represented by $In_xAl_yGa_{1-x-y}N$ ($0<x \leq 1$, $0<y \leq 1$, $0<x+y \leq 1$). The emission in the ultraviolet region becomes possible by increasing the Al content. The emission in the longer wavelength range also becomes possible and a light in the range of 360 nm to 580 nm can be emitted. Moreover, the luminous efficiency improves when the active layer 206 is formed with the quantum well structure. Here, the quantum well structure is either a single quantum well structure or a multiquantum well structure. The well layer which becomes the luminescent layer includes In, however, the barrier layer need not include In. Here, the mixed crystal of In is $0 \leq x \leq 0.5$ in the composition of the well layer. Next, a p-side electron confinement layer 207 of $Al_xGa_{1-x}N$ ($0 \leq x \leq 1$) doped with a p-type impurity, a p-side optical guide layer 208 of $Al_xGa_{1-x}N$ ($0 \leq x \leq 1$), a superlattice structure consisting of a p-side cladding layer 209 of $Al_xGa_{1-x}N$ ($0 \leq x \leq 1$) doped with a p-type impurity and an undoped $Al_xGa_{1-x}N$ ($0 \leq x \leq 1$) are grown as the p-side layer. By this process, the nitride semiconductor layer is constructed.

Here, the n-side contact layer 202 is either a single layer or a multilayer structure. When a multilayer structure is grown, the first layer of $Al_xGa_{1-x}N$ ($0 \leq x \leq 1$) and the second layer of $Al_yGa_{1-y}N$ ($0 \leq y \leq 1$) are stacked to form a superlattice structure. Moreover, the second layer may be undoped. When the nitride semiconductor substrate 101 is doped with an n-type impurity, the n-side contact layer can be omitted.

The specific examples of the n-type impurities include Si, Ge, Sn, S, O, Ti, Zr, and Cd and the like. The specific examples of the p-type impurities include Mg and other compounds such as Be, Zn, Mn, Ca, and Sr. The concentration of an impurity to be doped is preferably in the range from $5 \times 10^{16}$/cm³ to $1 \times 10^{21}$/cm³ inclusive. When the impurity concentration is greater than $1 \times 10^{21}$/cm³, the crystallinity of the nitride semiconductor layer tends to degrade and the output tends to decline.

This is similar to the case of modulation doping. The nitride semiconductor layer is grown by using a vapor phase growth method such as the metal organic chemical vapor deposition (MOCVD) method, the halide vapor phase epitaxy (HVPE) method, and the molecular beam epitaxy (MBE) method.

(Third Process)

Figure 7C:
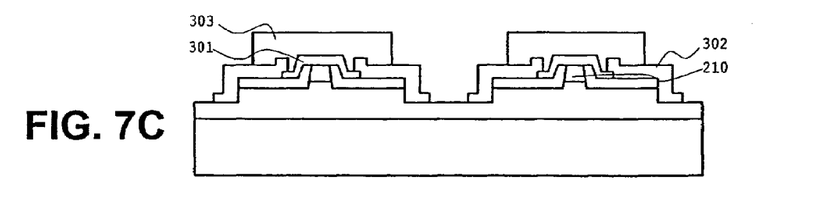

Next, a ridge-shaped stripe is formed in order to construct an optical waveguide region (FIG. 7C). A protective layer 302 made of $SiO_2$ is disposed on the surface of the p-side contact layer 210 which is the top layer of the nitride semiconductor layer 200, then the etching is carried out by using a RIE (reactive ion etching) process to form the ridge. The stripe width of the ridge is controlled from 1.0 μm to 50.0 μm. In order to obtain a single-spot laser beam, the stripe width of the ridge is preferably controlled from 1.0 μm to 2.0 μm. Moreover, in the present invention, electric current is applied in the longitudinal direction, so that it is possible to apply a large current. Consequently, the ridge width can be formed as 10 μm or more, which realizes an output of 150 mW or greater. The height of the ridge stripe (depth of the etching) only has to be in a range sufficient to expose the p-side optical guide layer 208. When a large current is applied, the electric current extends rapidly in the lateral direction beneath the ridge. Therefore, the etching depth to form the ridge is preferably reaching into the p-side optical guide layer 208.

Although wet etching and dry etching may be employed for forming the ridge, dry etching is preferably used because it is easy to control. For example, dry etching such as RIE (reactive ion etching) can be used. In this case, gaseous chlorine and chlorine compounds such as $Cl_2$, $CCl_4$, and $SiCl_4$, which are commonly used in etching other group III-V compound semiconductors, are used for etching of the nitride semiconductor.

An insulation layer 300 is disposed on both sides of the ridge, after the ridge stripe is formed. Besides $SiO_2$, an oxide of Ti, Zr, V, Nb, Hf, Ta and the like can be used as a material for the insulation layer 300. After that, the p-electrode 301 is formed over the p-side contact layer 210 which is the top surface of the ridge. The p-electrode 301 is formed of, for example, Ni/Au.

In this invention, the material for the p-pad electrode 303 formed on the p-electrode 301 is not especially limited when the ridge-shaped stripe has a narrow width as described above. However, it is preferable to use a material with good adhesion to the protective layer 302 by the same length as the stripe. By this, exfoliation of the p-pad electrode 303 and the p-electrode 301 can be prevented at the time of cleavage.

(Fourth Process)

Next, the inclined planes which are other than (000-1) plane are exposed by forming a step in the (000-1) plane which is at the rear surface of the nitride semiconductor substrate 101. The rear surface of the nitride semiconductor substrate 101 is the second main surface. First, dry etching such as RIE is carried out in order to make steps comprising recesses and protrusions in the (000-1) plane. Here, a step has the interfacial step height of 0.1 μm or more, and is formed into a tapered or an inverse tapered shape. The planar shape of a pattern for the steps, which include recesses and/or protrusions, is selected from stripe, grate, island-shape, circle, polygon, comb-shape, and mesh. For example, when protrusions with a circular planar shape are formed, their diameters are controlled to be 5 μm or more. Moreover, it is preferable that when the groove has a width of at least 3 μm, the electrode and the like can be prevented from being detached. An off-angle may be controlled within the range from 0.2° to 90° to expose the inclined planes which are other than the (000-1) plane. Here, the forming steps comprising recesses and protrusions on the second surface of the nitride semiconductor substrate 101 can be omitted.

The nitride semiconductor substrate 101 has the first main surface, the second main surface opposite to the first main surface, and a first region and a second region with different crystal growth surfaces. When the first region on the second main surface is the (000-1) plane, the second region is an inclined plane other than the (000-1) plane such as a (0001) plane. In the present invention, the nitride semiconductor laser device has the ridge-shaped stripe and it is preferable that the first region and the second region are formed into alternate stripes. Dislocations reaching to the resonant surfaces can be reduced by forming the ridge-shaped stripe on a surface having a single crystal growth surface. Moreover, a cleavage plane with reduced roughness can be obtained. Therefore, the nitride semiconductor laser device can be made with a high reliability.

Figure 7D:
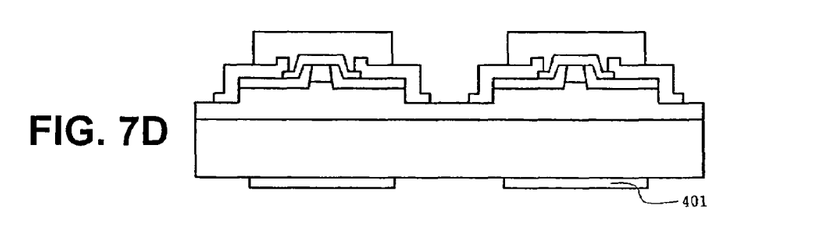

After that, the n-electrode 401 is formed on the rear surface of the nitride semiconductor substrate 101 by a method such as CVD, sputtering, and deposition (FIG. 7D). The thickness of the n-electrode is 10,000 Å or less, and preferably 6,000 Å or less. In the case where the n-electrode is formed as a multilayer structure and the first layer is made of Ti or Mo, the thickness of the first layer is controlled to be 100 Å or less. When the first layer is made of W, the thickness is preferably 300 Å or less, because good ohmic features can be obtained. The first layer can also be made of V. When the n-electrode disposed on the second main surface of the nitride semiconductor substrate 101 is formed as a multilayer structure, the first layer is preferably made of V, because the heat resistance improves. Here, by forming the V with a thickness from 50 Å to 300 Å inclusive, and preferably from 70 Å to 200 Å inclusive, excellent ohmic features can be obtained.

When the n-electrode is made of Ti/Al, the total thickness is controlled to be 10,000 Å or less, for example, the thickness is 100 Å/5,000 Å. In the n-electrode, when the layers are stacked from the nitride semiconductor side in order of Ti/Pt/Au, the thickness of the layers is 60 Å/1,000 Å/3,000 Å. In another n-electrode, when the layers are stacked from the nitride semiconductor side in order of Ti/Mo/Pt/Au, the thickness of the layers is, for example, Ti(60 Å)/Mo(1,000 Å)/Pt(1,000 Å)/Au(3,000 Å). When the n-electrode is Ti/Hf/Pt/Au, the thickness is, for example, Ti(60 Å)/Hf(60 Å)/Pt(1,000 Å)/Au(3,000 Å). In the case where the n-electrode is Ti/Mo/Ti/Pt/Au, the layers can be stacked in order of Ti(60 Å)/Mo(5,000 Å)/Ti(500 Å)/Pt(1,000 Å)/Au(2,100 Å). When the n-electrode is W/Pt/Au, W/Al/W/Au and the like, the characteristics described above are shown. Other examples of the n-electrode comprise Hf/Al, Ti/W/Pt/Au, Ti/Pd/Pt/Au, Pd/Pt/Au, Ti/W/Ti/Pt/Au, Mo/Pt/Au, Mo/Ti/Pt/Au, W/Pt/Au, V/Pt/Au, V/Mo/Pt/Au, V/W/Pt/Au, Cr/Pt/Au, Cr/Mo/Pt/Au, and Cr/W/Pt/Au stacked in sequence from the nitride semiconductor side. Moreover, after forming the n-electrode, annealing may be carried out at 300° C. or more.

The n-electrode can be formed with a pattern applied over a region except for the region including a scribing line and/or a cleavage line. In addition, when a metallized electrode (optional) is formed on the n-electrodes with a pattern similar to the n-electrode, scrubbing becomes easy and the cleavage property improves. Ti—Pt—Au—(Au/Sn), Ti-—Pt—Au—(Au/Si), Ti—Pt—Au—(Au/Ge), Ti—Pt—Au—In, Au/Sn, In, Au/Si, and Au/Ge, etc. can be used as the metallized electrode.

(Fifth Process)

After the n-electrode is formed, the nitride semiconductor device is divided into bars by scribing from the first main surface and/or the second main surface side of the m-plane (1-100) of the nitride semiconductor substrate 101 in the direction perpendicular to the stripe-shaped electrode. The n-electrode only has to be formed on a portion or the entire portion of the second main surface of the nitride semiconductor substrate 101, and may be formed not only in the first region which is right under the ridge-shaped stripe but also in the second region.

Figure 4:
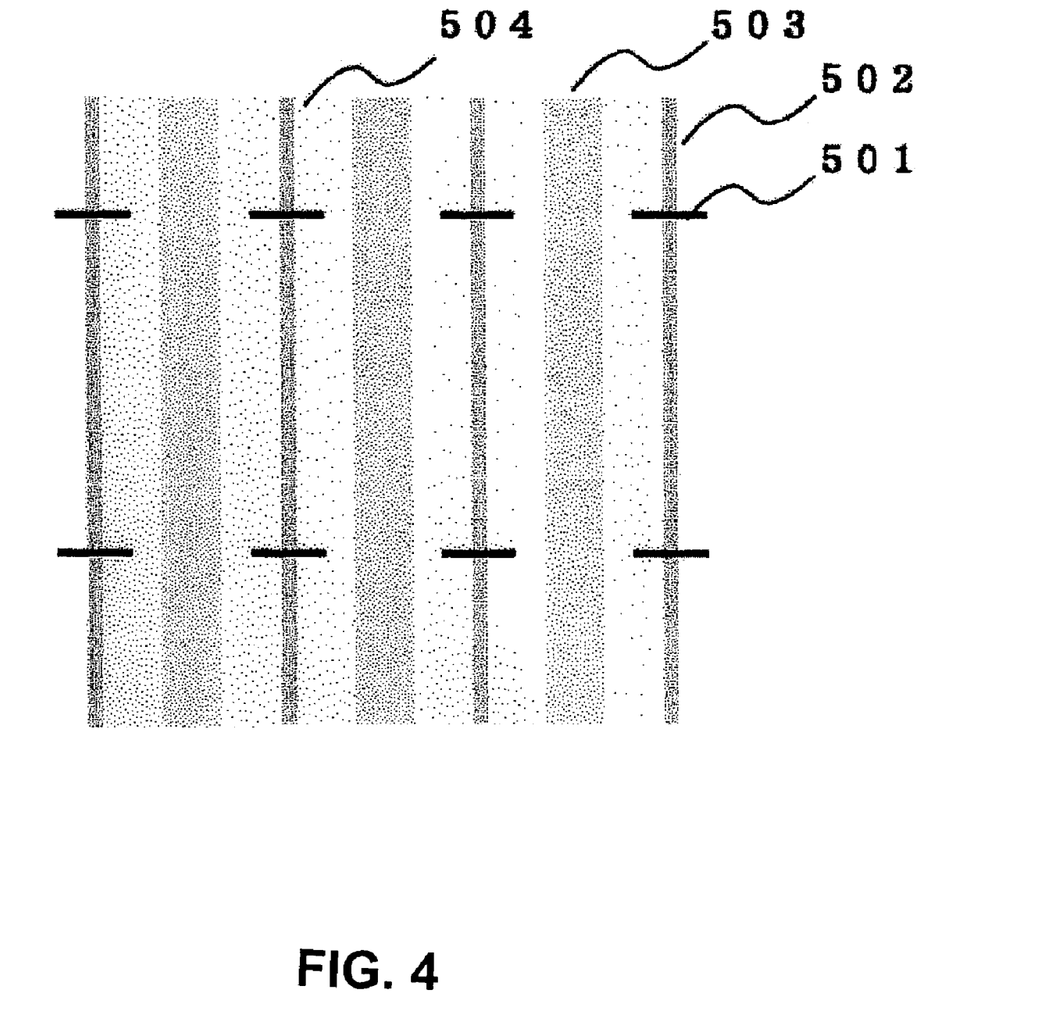
FIG. 4 shows a top surface of a wafer according to the first embodiment of the present invention.

The process of dividing the nitride semiconductor device into bars will be described below. In the first step, the nitride semiconductor substrate 101 where a first region 504 and a second region 502 are formed into alternate stripes, a groove 501 is formed in the direction perpendicular to the second region 502 extending in a stripe-shape from the first main surface and/or the second main surface (FIG. 4). FIG. 4 shows a wafer observed from the top surface.

Here, the first region 504 only has to be formed between the second regions 502, and the first region 504 may include a third region 503 as another region. The stress generated in the nitride semiconductor substrate can be further eased by forming a third region having a different crystal growth surface in the first region 504. Specifically, the third region 503 is formed as a surface at a off-angle in the range from 0.1° to 25° inclusive with the first region. A groove 501 can be formed in the third region 503 with the same conditions as a groove 501 formed in the second region 502.

Figure 7E:
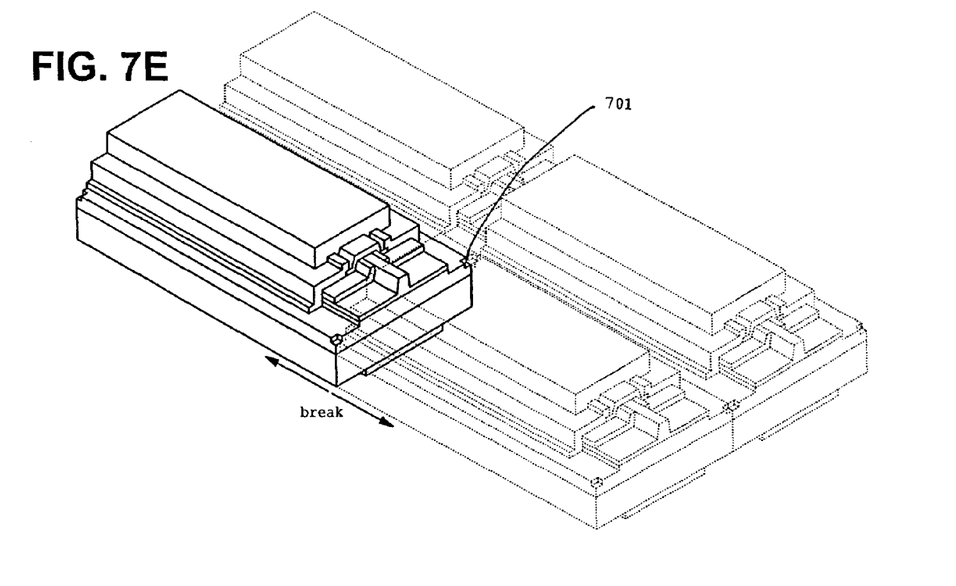

The groove 501 is formed at least in the second region 502 in the stripe-width direction with a width equal to or greater than a half width of the stripe in the second region 502. Specifically, the width is from 20 μm to 200 μm inclusive. It is preferable to form the groove 501 with a width 2 μm or more in the length direction of the stripe in the second region 502. The depth of the groove 501 is from 0.5 μm to 50 μm inclusive, and preferably from 0.5 μm to 10 μm inclusive. In addition to point-scribing using a diamond point, specific examples of the method of forming the groove 501 comprise laser scribing and RIE with a masking of a desired pattern. Next, in the second step, the nitride semiconductor device is then divided into bars by blade breaking, roller braking, or press braking after forming the grooves. Either the process of dividing into the bars or the process of forming the grooves 501 can be processed first. However, it is preferable that the wafer isdivided into bars after forming the .grooves 501, because a resonance surface can be easily obtained as a mirror surface. In this case, breaking, which is the second step, is preferably carried out from the main surface which is opposite from the main surface where the groove 501 is formed. The groove or recessed area 701 only needs to be located in the right and the left sides, over or beneath the end surface of the optical waveguide (FIGS. 7E and 8).

The shape of the nitride semiconductor device after it is formed into chips is rectangular with the resonance side width of 500 μm or less, and preferably 400 μm or less. A part of the groove 501 remains in a laser device even after the laser device is formed into a rectangular shape. Here, the length of groove 501 is 10 μm or more, and preferably 20 μm or more along the resonant surface, and from 0.5 μm to 50 μm inclusive in the depth direction. By this construction, the occurrence of a ripple in the FFP can be prevented.

Figure 5:
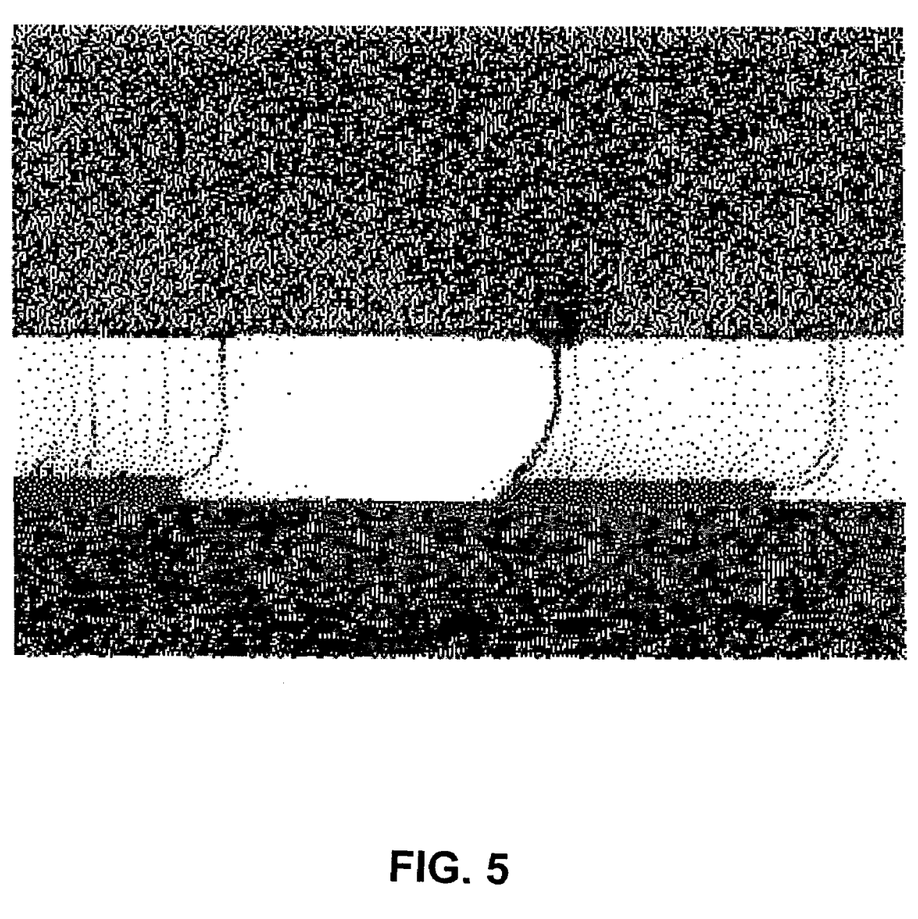
FIG. 5 is a photograph showing an end face of a nitride semiconductor laser device according to the first embodiment of the present invention.
Figure 6:
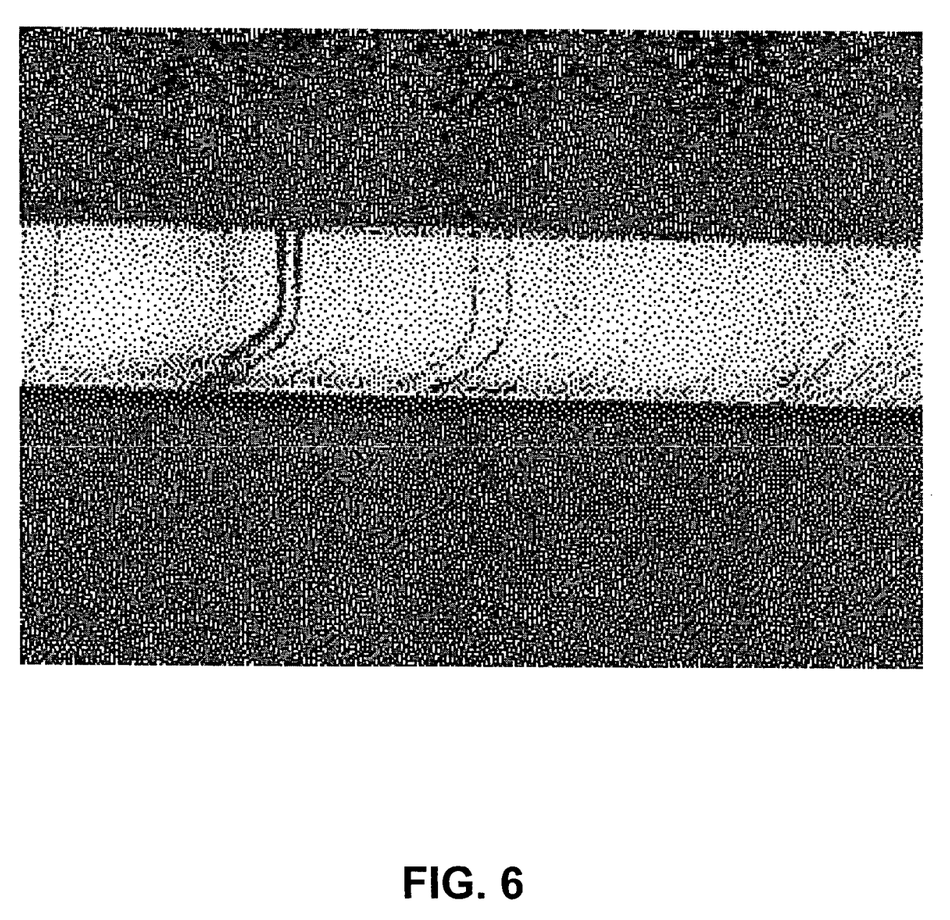
FIG. 6 is a photograph showing an end face of a nitride semiconductor laser device according to a comparative experiment.

When the groove 501 is used as a cleavage-assist groove, the cleavage steps to make bars can be easily carried out. Moreover, when the groove 501 is used as the cleavage-assist groove, the amount of flaws occurring in the resonance surface can be reduced to the degree that a flaw does not exist in the optical waveguide region (FIG. 5). A number of flaws occur when the cleavage is carried out without the grooves 501 (FIG. 6).

Here, a reflecting mirror may be disposed on the resonance surface. The bar-shaped wafer is further divided in the direction along the stripe of the electrode in order to make the nitride semiconductor laser device into chips (FIG. 8). An end surface of the nitride semiconductor laser device in the direction of the optical waveguide is preferably formed in the first region and the second region of the nitride semiconductor substrate. By this construction, damage caused by forming chips does not spread to the first region, therefore, the chips can be obtained with a good yield ratio. As a result, the nitride semiconductor laser device obtains characteristics such as long life.

Embodiment 3

The nitride semiconductor device may have a structure which includes a current blocking layer. After forming the n-side contact layer 202, the crack preventing layer 203, the n-side cladding layer 204, and the n-side optical guide layer 205 are formed on the nitride semiconductor 1. The current blocking layer is then formed with a stripe-shaped opening with a width of from 0.5 to 3.0 μm and a thickness of 3,000 Å or less. Next, the active layer having a quantum well structure 206 is formed on the n-side optical guide layer which is exposed at the opening of the current blocking layer. Then, the p-side electron confinement layer 207, the p-side optical guide layer 208, the p-side cladding layer 209, and the p-side contact layer 210 are formed. The current blocking layer can be made of an i-type or intrinsic nitride semiconductor or other insulating materials such as $SiO_2$, or $Al_2O_3$.

The current blocking layer is not limited to being formed after growing the n-side optical guide layer. The current blocking layer is grown on the surface of the n-side nitride semiconductor layer or the p-side semiconductor layer after forming them. Then, an opening is formed in the current blocking layer with the stripe width of from 0.3 to 20 μm, preferably from 0.5 to 3.0 μm. After that, the nitride semiconductor layer is re-grown. Here, the thickness of the current blocking layer is from 0.01 μm to 5 μm, which is sufficient for re-growing the nitride semiconductor layer. Other processes are carried out in the same manner as in Embodiments 1 and 2.

EXAMPLES

The examples according to the embodiments of the present invention will be described below. However, the present invention is not limited to these examples.

Example 1

A foreign substrate made of sapphire having a C-plane as a main surface is set in the MOVPE reactor vessel. The temperature is adjusted to 500° C. and a buffer layer made of GaN is grown to the thickness of 200 angstroms, using trimethylgallium (TMG) and ammonia ($NH_3$). After growing the buffer layer, the temperature is adjusted to 1050° C. and an underlayer made of GaN is grown to a thickness of 4 μm. A protective layer is partially formed on the underlayer in preparation for selective growth of the nitride semiconductor.

After the underlayer is grown, the wafer is taken out from the reactor vessel and a stripe-shaped photomask is disposed on the surface of the underlayer. Then, a protective layer of $SiO_2$ is formed with a stripe width from 10 to 300 μm and a stripe interval (window portion) from 5 to 300 μm.

(Nitride Semiconductor Substrate)

Figure 3:
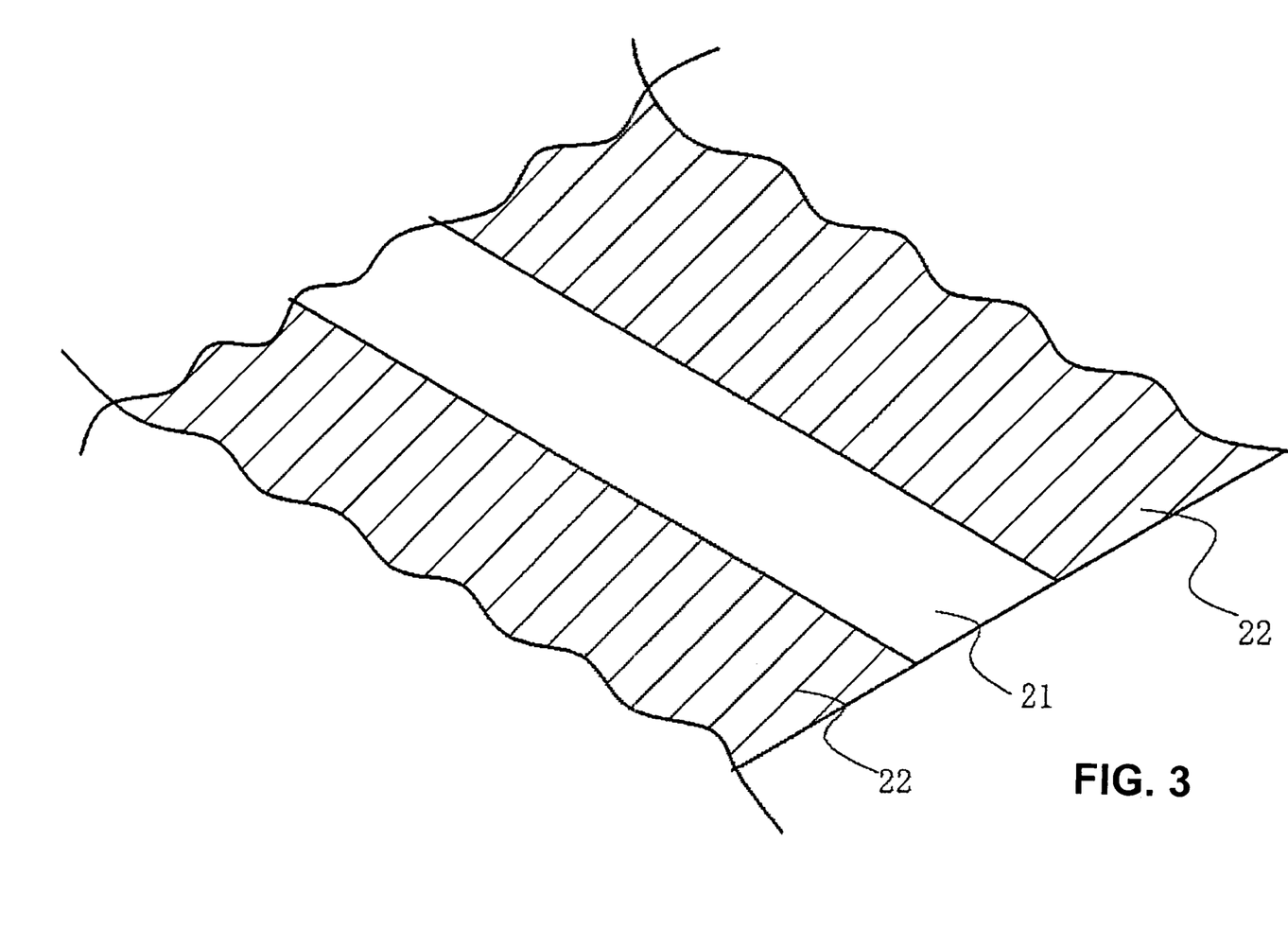
FIG. 3 is a schematic cross sectional view showing a nitride semiconductor substrate according to the first embodiment of the present invention.

After forming the protective layer, the wafer is once again set in the reactor vessel of MOVPE. The temperature is adjusted to 1050° C. and a nitride semiconductor made of GaN is grown to a thickness of 20 μm, using TMG and ammonia. The nitride semiconductor substrate is grown in the lateral direction on the protective layer. Therefore, the crystal defect density thereof is $10^6/cm^2$ or less, which is lower than that of the underlayer by two digits or more. Then, the wafer is transferred to the HVPE (halide vapor phase epitaxy) apparatus, and a nitride semiconductor made of GaN is grown to a thickness of 400 μm, using Ga metal, HCl gas and ammonia as the raw materials. Thus, when the GaN layer with a thickness of 100 μm or more is grown by the HVPE method after the nitride semiconductor was grown on the protective layer by the MOVPE method, the crystal defect density further decreases by one digit or more. The foreign substrate or the like is then removed by way of polishing or CMP, etc. Thus, the nitride semiconductor substrate of GaN (400 μm) is obtained. Here, a first region with a low dislocation and a second region with high dislocation exist in the substrate. The first region 21 is a (0001) plane with the stripe width of 100 μm or more. An optical waveguide is formed over the first region 21. The second region 22 is a (000-1) plane with the stripe width 100 μm or more. The first region 21 and the second region 22 are formed into alternate stripes (FIG. 3).

(N-Side Contact Layer 202)

Next, an n-side contact layer 5 made of GaN doped with $3 \times 10^{18}/cm^3$ of Si is grown on the nitride semiconductor substrate 101 to a thickness of 4 μm at 1050° C., using ammonia and TMG, and silane gas as the impurity gas. The n-side contact layer is optional when the nitride semiconductor substrate is doped with (or includes) an n-type impurity.

(Crack Preventing Layer 203)

Next, the temperature is adjusted to 800° C., and a crack preventing layer made of $In_{0.06}Ga_{0.94}N$ is grown to a thickness of 0.15 μm using TMG, TMI (trimethyl indium), and ammonia. This crack preventing layer is optional.

(N-Side Cladding Layer 204)

Subsequently, a layer of undoped $Al_{0.16}Ga_{0.84}N$ is grown to a thickness of 25 angstroms using TMA (trimethylammonium), TMG, and ammonia at 1050° C. Then, the TMA is stopped and silane gas is supplied. A layer made of GaN doped with $3 \times 10^{19}/cm^3$ of Si is grown to a thickness of 25 angstroms. These layers are alternately stacked to form a superlattice structure. Thus, an n-side cladding layer having a superlattice structure is grown to a total thickness of 1.2 μm.

(N-Side Optical Guide Layer 205)

Subsequently, silane gas is stopped and an n-side optical guide layer made of undoped GaN is grown to a thickness of 0.1 μm at 1050° C. An n-type impurity may be doped in the n-side optical guide layer.

(Active Layer 206)

Next, the temperature is adjusted to 800° C. and a barrier layer made of $In_{0.05}Ga_{0.95}N$ doped with Si is grown to a thickness of 100 angstroms. Subsequently, a well structure layer made of undoped $In_{0.2}Ga_{0.8}N$ is grown to a thickness of 40 angstroms at the same temperature. The barrier layer and the well structure layer are alternately stacked twice and finally, the barrier layer is stacked on the top. Thus, an active layer having a multiquantum well (MQW) structure with a total thickness of 380 angstroms is grown.

(P-Side Cap Layer 207)

Next, the temperature is raised to 1050° C. and a p-side cap layer 207 made of $Al_{0.3}Ga_{0.7}N$ doped with $1 \times 10^{20}/cm^3$ of Mg, whose bandgap energy is greater than that of the p-side optical guide layer 208, is grown to a thickness of 300 angstroms by using TMG, TMA, ammonia, and $Cp_2Mg$ (cyclopentadienyl magnesium).

(P-Side Optical Guide Layer 208)

Subsequently, $Cp_2Mg$ and TMA are stopped and a p-side optical guide layer made of undoped GaN whose bandgap energy is smaller than that of the p-side cap layer 207 is grown to a thickness of 0.1 μm at 1050° C.

(P-Side Cladding Layer 209)

Subsequently, at 1050° C., a layer made of undoped $Al_{0.16}Ga_{0.84}N$ is grown to a thickness of 25 angstroms. Then, $Cp_2Mg$ and TMA are stopped and a layer made of undoped GaN is grown to a thickness of 25 angstroms. Thus, a p-side cladding layer is grown with a total thickness of 0.6 μm.

(P-Side Contact Layer 210)

Finally, at 1050° C., a p-side contact layer made of p-type GaN doped with $1\times10^{20}/cm^3$ of Mg is grown on the p-side cladding layer to a thickness of 150 angstroms.

The wafer where the nitride semiconductor is grown as described above is taken out from the reactor vessel and a protective layer made of $SiO_2$ is disposed on the surface of the p-side contact layer which is the top layer. Then, etching is carried out by way of RIE (reactive ion etching) using $SiCl_4$ gas. Thus, a ridge-shaped stripe is formed.

Next, a p-electrode 301 consisting of Ni/Au is formed on the surface of the p-side contact layer 210. After the p-electrode is formed, a protective layer 302 is formed on the p-electrode 301 to a thickness of 0.1 μm by way of sputtering.

Next, a p-pad electrode 303 of Ti (1,000 angstroms)/Au (8,000 angstroms) is disposed continuously on the exposed p-electrode 301, which is not covered with the protective layer 201.

After the p-pad electrode 303 is disposed, an n-electrode 401 of Ti/Al is disposed on the second main surface of the nitride semiconductor substrate 101.

A groove is formed on the second main surface side of the wafer-shaped nitride semiconductor substrate, where the n-electrode, the p-electrode, and the p-pad electrode 303 have been disposed as described above. The depth of the groove is controlled to be 10 μm. The widths thereof are 50 μm along the resonance surface and 15 μm in the direction perpendicular to the resonance surface. Next, the nitride semiconductor substrate 101 is divided into bars from the n-electrode side by using the grooves as cleavage-assist lines. A cleavage plane (1-100 plane, which corresponds to a side surface of a hexagonal columnar crystal prism=M plane) thus formed becomes the resonance surface.

Figure 2:
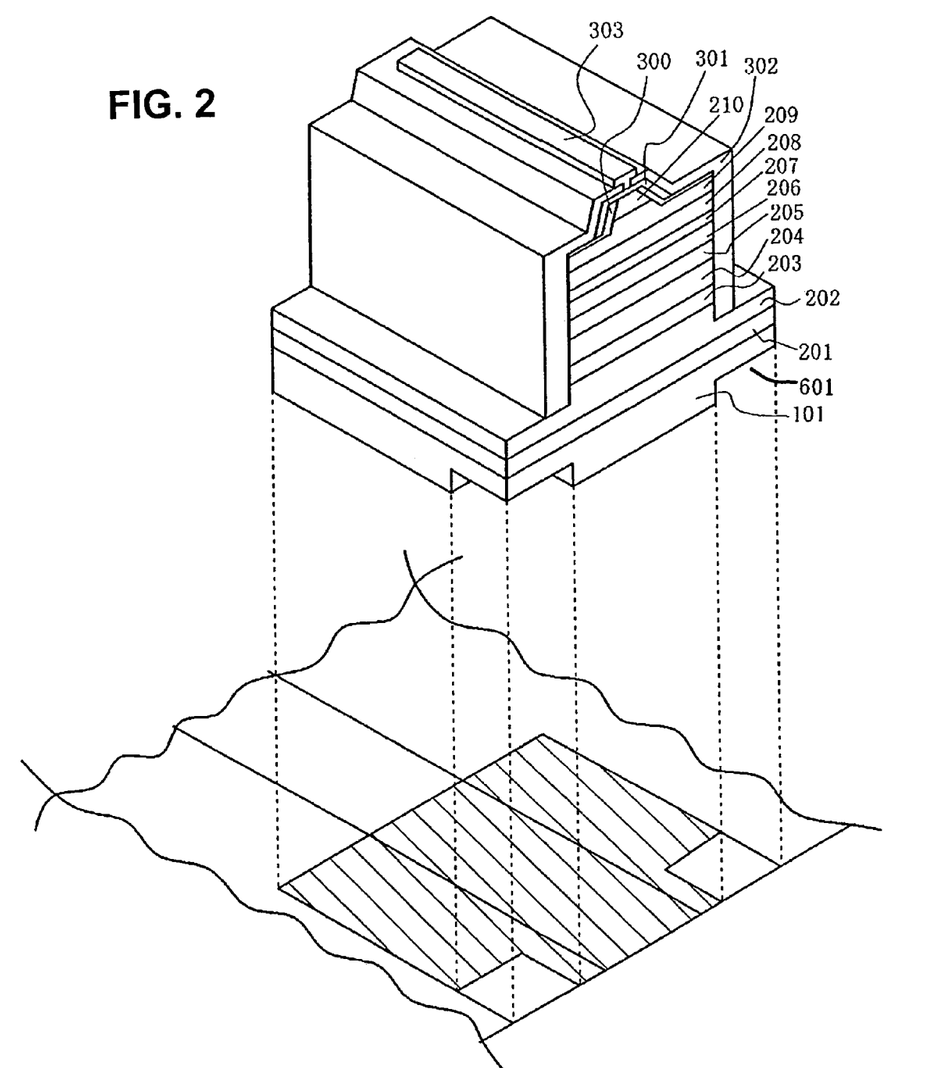
FIG. 2 is a perspective sectional view showing the nitride semiconductor laser device according to the first embodiment of the present invention.

Next, a dielectric multilayer made of $SiO_2$ and $TiO_2$ is formed on the resonance surface, then, finally, the bar is divided along the p-electrode 301 so as to make the chips of the nitride semiconductor laser devices (FIG. 2). FIG. 1 shows a perspective view of the nitride semiconductor laser device made into a chip. FIG. 2 shows a perspective view of the nitride semiconductor laser device and also illustrates that a groove or recessed area 601 of the nitride semiconductor device is formed in the second region of the substrate where the first region and the second region are formed into alternate stripes. The length of the resonator is controlled to be from 300 to 1,000 μm. Here, each of the right and left corners of the nitride semiconductor laser device has a groove or recessed area 601. The groove or recessed area 601 has a depth of 10 μm and the widths of 30 μm in the parallel direction and 10 μm in the direction perpendicular to the resonance surface.

When the laser device is mounted on the heatsink and the p-electrode is wire-bonded, excellent continuous-wave laser oscillation is observed at room temperature with the emission wavelength from 400 to 420 nm and the threshold current density of 2.9 $kA/cm^2$. Furthermore, even when the resonance surface is made by cleavage, a laser device which has an excellent lifetime without having cleavage flaws can be obtained with good reproducibility.

Example 2

In the processes according to Example 1, silane gas is added to the raw materials in the HVPE apparatus when a nitride semiconductor substrate 101 is formed, and the nitride semiconductor substrate 101 made of GaN doped with $1\times10^{18}/cm^3$ of silicon (Si) or oxygen (O) is grown to a thickness of 500 μm. Here, it is preferable to adjust the Si concentration in the range from $1\times10^{17}/cm^3$ to $5\times10^{19}/cm^3$. After the nitride semiconductor substrate 101 is grown, the sapphire substrate and the buffer layer are removed by laser irradiation or polishing in the same manner as in Example 1. Thus, the nitride semiconductor substrate 101 is obtained. When the semiconductor laser device is made in the same manner as in Example 1 except for as described above, the laser device having the same advantages as those devices according to Example 1 can be efficiently obtained.

Example 3

The nitride semiconductor substrate 101 having a first region, a second region, and further a third region is used in the Example 1. In the first main surface, the first region is in a (0001) plane and the second region is in a (000-1) plane. The third region is a sloped plane that inclines from the (0001) plane at an angle of 25° or less. These regions are formed into stripes, that is, the second region/the third region/the second region is interposed between the first regions in stripes in sequence. In the process where the wafer is cut into bars, grooves are formed from the first main surface side to the second region and the third region of the nitride semiconductor substrate 101. The groove is formed with 200 μm or less in the width direction of the stripe and 20 μm or less in the length direction of the stripe. The depth of the groove is about 10 μm. When the nitride semiconductor laser device is formed in the same manner as in Example 1, except as described above, a laser device having the same advantages as those devices according to Example 1 can be obtained.

INDUSTRIAL APPLICABILITY

The present invention can be used in light emitting devices such as laser devices and light emitting diodes (LEDs), solar batteries, photodetectors such as optical sensors, or for electron devices such as transistors.

It is to be understood that although the present invention has been described with regard to preferred embodiments thereof, various other embodiments and variants may occur to those of the skilled in the art, which are within the scope and spirit of the invention, and such other embodiments and variants are intended to be covered by the following claims.

This application is based on Japanese Patent Application No. 2003-273195 filed on Jul. 11, 2003, and Japanese Patent Application No. 2003-371557 filed on Oct. 31, 2003, the contents of which are incorporated herein by reference.

What is claimed is:

1. A nitride semiconductor laser device comprising:
   a nitride semiconductor substrate having a first main surface and a second main surface located on opposite sides of said nitride semiconductor substrate;
   a nitride semiconductor layer disposed on said first main surface of said nitride semiconductor substrate;
   a ridge-shaped stripe disposed on said nitride semiconductor layer, said ridge-shaped stripe having a longitudinal axis; and a resonance surface forming an optical waveguide in a direction perpendicular to the longitudinal axis of said ridge-shaped stripe;

wherein both said first main surface and said second main surface comprise 1) a first region having a first crystal growth surface in a first crystal growth plane, and 2) a second region having a second crystal growth surface at least different from that of the first region, and at least one of said first main surface and said second main surface of said nitride semiconductor substrate includes a recessed area disposed in the second region.

2. The nitride semiconductor laser device according to claim 1, wherein said first region and said second region are disposed adjacent to each other.

3. The nitride semiconductor laser device according to claim 1, wherein the first region on said second main surface is located substantially beneath the first region of said first main surface, and the second region of said first main surface is located substantially above the second region of said second main surface.

4. The nitride semiconductor laser device according to claim 1, wherein the first crystal growth plane is the (0001) plane.

5. The nitride semiconductor laser device according to claim 1, wherein the recessed area disposed in the second region has a width of at least 2 μm.

6. The nitride semiconductor laser device according to claim 1, wherein the recessed area disposed in the second region has a length of at least 10 μm.

7. The nitride semiconductor laser device according to claim 1, wherein the recessed area disposed in the second region has a depth of at least 0.5 μm.

8. The nitride semiconductor laser device according to claim 1, wherein said first main surface of said nitride semiconductor substrate includes a recessed area disposed in the second region.

9. The nitride semiconductor laser device according to claim 1, wherein said second main surface of said nitride semiconductor substrate includes a recessed area disposed in the second region.

10. A nitride semiconductor laser device comprising:
a nitride semiconductor substrate having a first main surface and a second main surface located on opposite sides of said nitride semiconductor substrate;
a nitride semiconductor layer disposed on said first main surface of said nitride semiconductor substrate;
a ridge-shaped stripe disposed on said nitride semiconductor layer, said ridgeshaped stripe having a longitudinal axis; and
a resonance surface forming an optical waveguide in a direction perpendicular to, the longitudinal axis of said ridge-shaped stripe;
wherein both said first main surface and said second main surface of said nitride semiconductor substrate comprise 1) a first region having a first crystal growth surface in a first crystal growth plane, and 2) a second region having a second crystal growth surface at least different from that of the first region, and at least one of said first main surface and said second main surface of said nitride semiconductor substrate includes a recessed area disposed in the second region;
wherein the first region of said first main surface is located substantially beneath the first region of said second main surface, and the second region of said first main surface is located substantially above the second region of said second main surface; and
wherein the first region on both said first main surface and said second main surface of said nitride semiconductor substrate has fewer dislocations than that in the second region on both said first main surface and said second main surface of said nitride semiconductor substrate.

11. The nitride semiconductor laser device according to claim 10, wherein a thickness of said nitride semiconductor substrate is from 50 μm to 99 μm.

12. The nitride semiconductor laser device according to claim 10, wherein said first main surface of said nitride semiconductor substrate includes a recessed area disposed in the second region.

13. The nitride semiconductor laser device according to claim 10, wherein said second main surface of said nitride semiconductor substrate includes a recessed ares disposed in the second region.

* * * * *